US010772188B1

(12) United States Patent
Elsasser et al.

(10) Patent No.: US 10,772,188 B1
(45) Date of Patent: Sep. 8, 2020

(54) STIFFENER COOLING STRUCTURE

(71) Applicant: INTERNATIONAL BUSINESS MACHINES CORPORATION, Armonk, NY (US)

(72) Inventors: Ryan Elsasser, Poughkeepsie, NY (US); David Charles Olson, Lagrangeville, NY (US); Brian Werneke, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/437,002

(22) Filed: Jun. 11, 2019

(51) Int. Cl.
  *H05K 7/20* (2006.01)
  *H05K 1/02* (2006.01)
  *H05K 7/14* (2006.01)

(52) U.S. Cl.
  CPC ......... *H05K 1/0201* (2013.01); *H05K 7/1461* (2013.01); *H05K 7/20145* (2013.01); *H05K 7/20163* (2013.01); *H05K 7/20172* (2013.01); *H05K 7/20409* (2013.01); *H05K 2201/10416* (2013.01)

(58) Field of Classification Search
  None
  See application file for complete search history.

(56) References Cited

U.S. PATENT DOCUMENTS

| 5,063,476 A * | 11/1991 | Hamadah | H01L 23/467 257/E23.099 |
| 5,142,441 A | 8/1992 | Seibold | |
| 5,361,188 A * | 11/1994 | Kondou | H01L 23/467 165/104.34 |
| 5,768,104 A | 6/1998 | Salmonson | |
| 6,222,729 B1 * | 4/2001 | Yoshikawa | H05K 7/20154 174/16.1 |
| 6,350,952 B1 | 2/2002 | Gaku | |

(Continued)

FOREIGN PATENT DOCUMENTS

| DE | 4012100 A1 | 10/1991 |
| EP | 844808 A2 | 5/1998 |

OTHER PUBLICATIONS

Wits, "Integrated Cooling Concepts for Printed Circuit Boards", By Wessel Willems Wits at the Faculty of Engineering Technology (CTW) of the University of Twente, Enschede, the Netherlands. Enschede, Dec. 4, 2008, pp. 1-161.

*Primary Examiner* — Courtney L Smith
(74) *Attorney, Agent, or Firm* — Tihon Poltavets

(57) ABSTRACT

An apparatus for providing a stiffener and cooling to a printed circuit board includes a printed circuit board coupled to a top surface of a stiffening cooling structure, where a lower surface of the printed circuit board is opposite the top surface of the stiffening cooling structure. One or more channels of the stiffening cooling structure defined by the top surface of the stiffening cooling structure, a bottom surface of the stiffening cooling structure, and one or more support members, where the one or more support members are positioned between the top surface of the stiffening cooling structure and the bottom surface of the stiffening cooling. One or more apertures in the top surface of the stiffening cooling structure directs airflow from the one or more channels of the stiffening cooling structure to one or more components disposed on a top surface of the printed circuit board.

15 Claims, 11 Drawing Sheets

(56) References Cited

U.S. PATENT DOCUMENTS

| | | | |
|---|---|---|---|
| 6,665,185 B1 | 12/2003 | Kulik | |
| 6,942,019 B2 | 9/2005 | Pikovsky | |
| 7,248,471 B2 | 7/2007 | Wabiszczewicz | |
| 7,327,569 B2 | 2/2008 | Belady | |
| 7,589,978 B1* | 9/2009 | Holdredge | H05K 7/20145 361/800 |
| 7,738,249 B2 | 6/2010 | Chan | |
| 7,826,214 B2* | 11/2010 | Shuy | F21K 9/00 361/679.47 |
| 8,279,607 B2 | 10/2012 | Horng | |
| 9,317,075 B2* | 4/2016 | Ng | H05K 7/20154 |
| 9,480,149 B2 | 10/2016 | Mokhtarzad | |
| 9,526,191 B2* | 12/2016 | Straznicky | H05K 7/20 |
| 2006/0120043 A1* | 6/2006 | Wolford | H05K 1/0272 361/695 |
| 2006/0133036 A1* | 6/2006 | Durney | G06F 1/20 361/695 |
| 2007/0041160 A1 | 2/2007 | Kehret | |
| 2007/0206353 A1* | 9/2007 | Boone | H05K 7/20727 361/694 |
| 2009/0213541 A1 | 8/2009 | Butterbaugh | |
| 2013/0170136 A1 | 7/2013 | Roby | |
| 2015/0116935 A1* | 4/2015 | Zhuang | H05K 7/20145 361/695 |
| 2017/0099746 A1* | 4/2017 | Rubenstein | H05K 1/0203 |

* cited by examiner

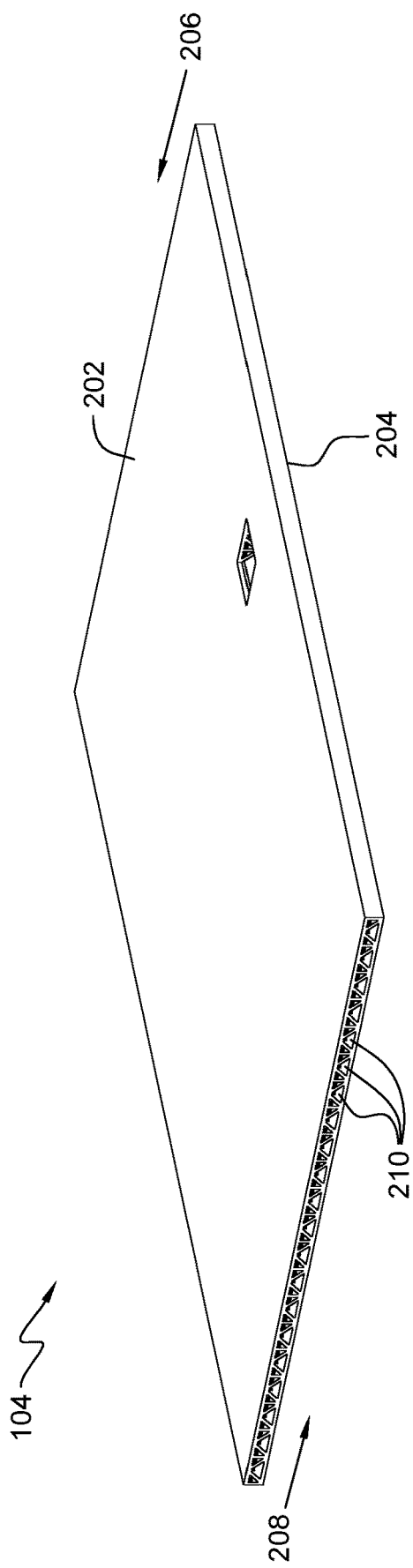
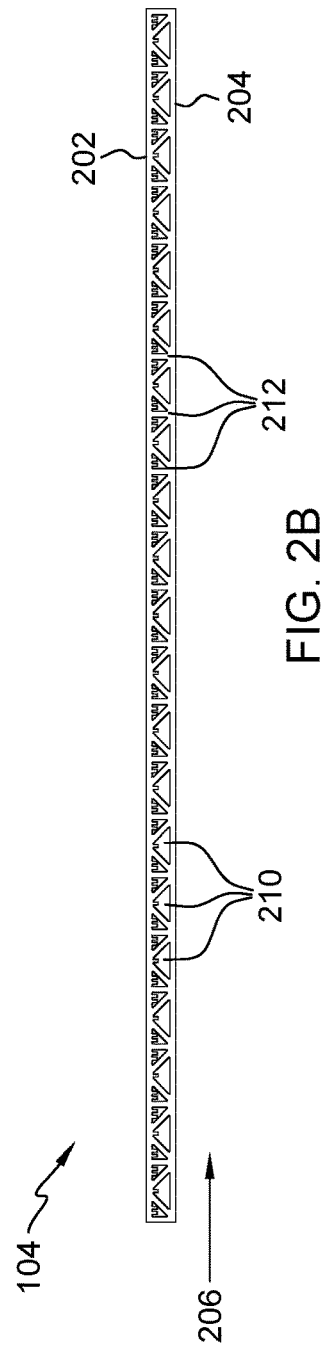
FIG. 2A
FIG. 2B

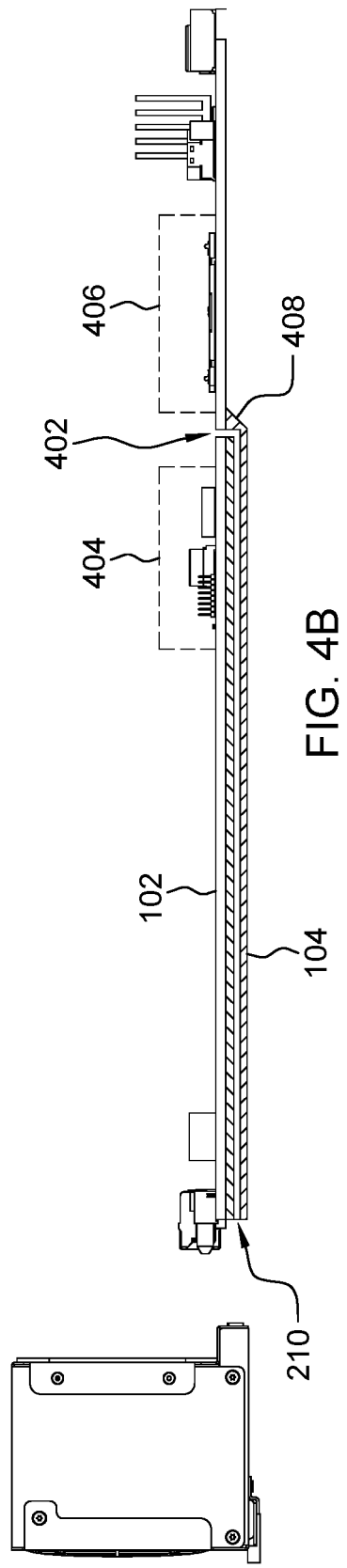

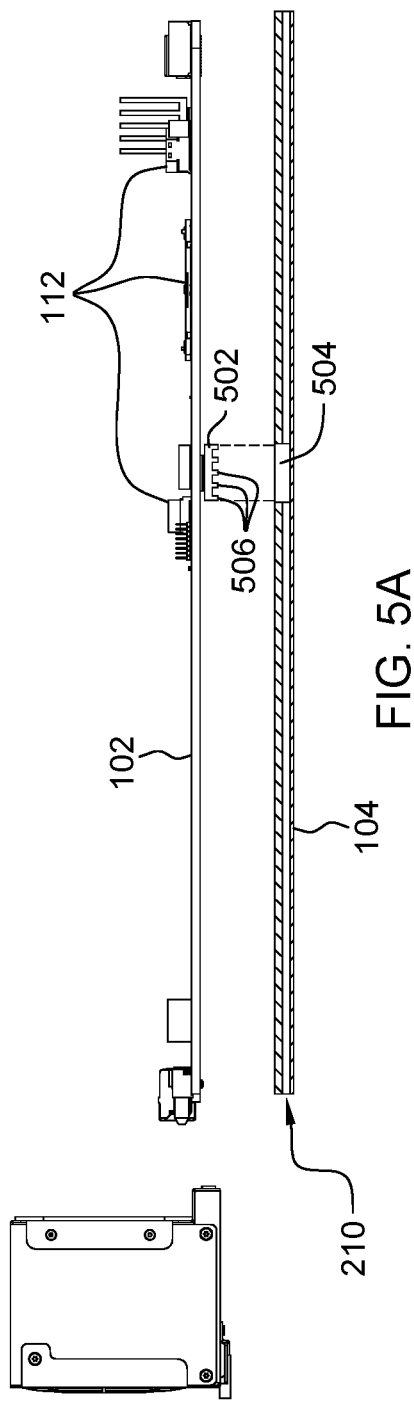
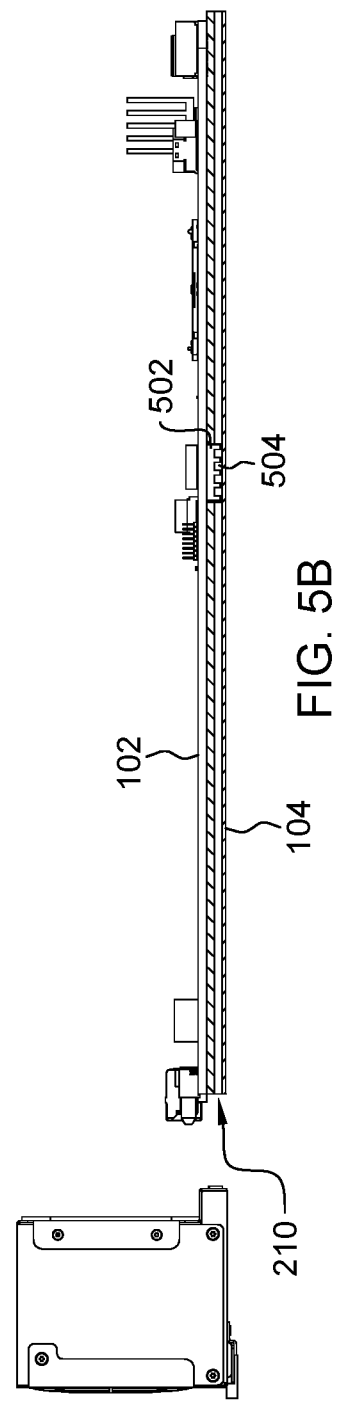

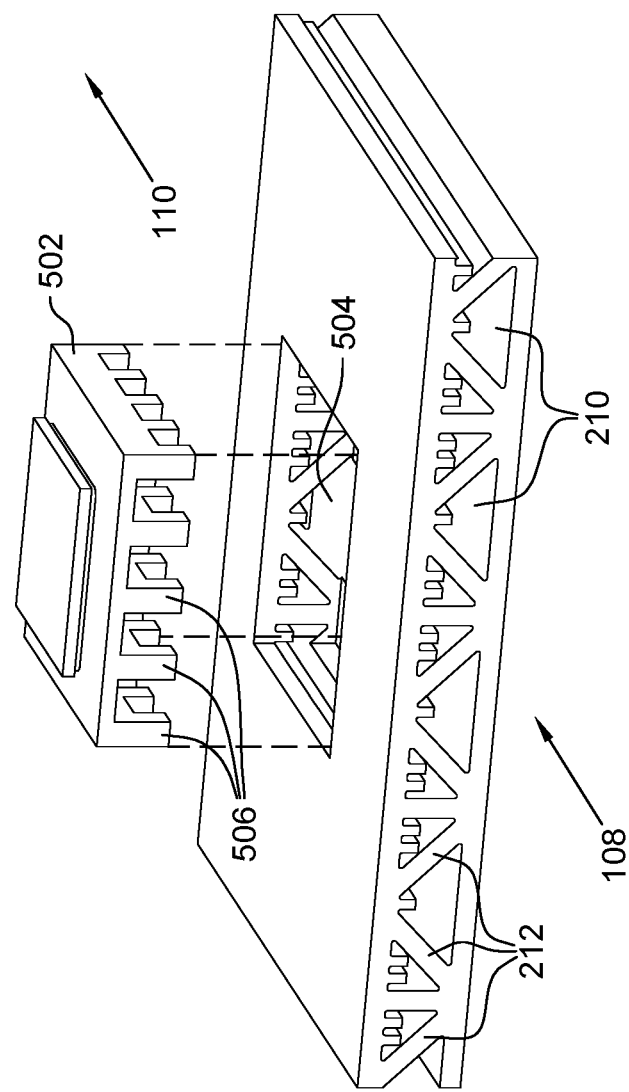

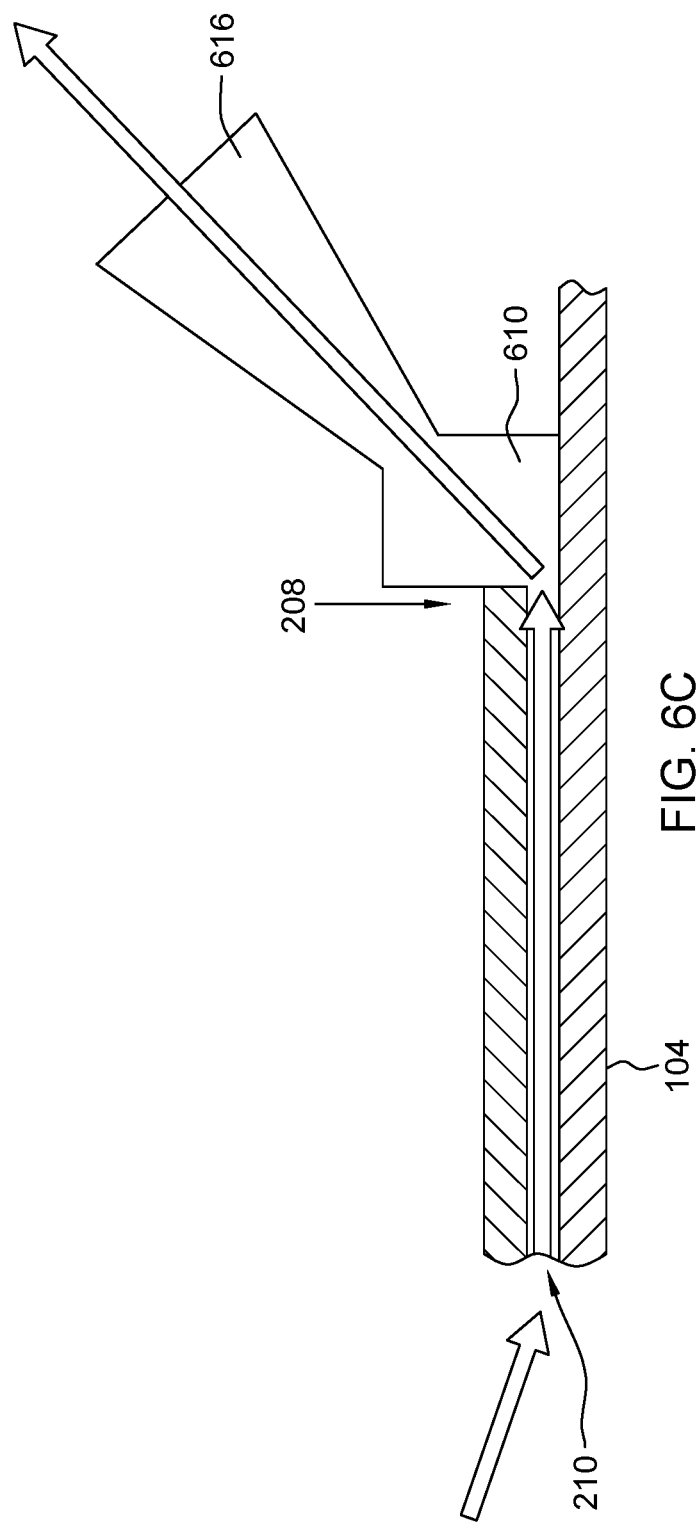

STIFFENER COOLING STRUCTURE

FIELD OF THE INVENTION

This disclosure relates generally to cooling structures, and in particular, to stiffener cooling structures utilizing internal airflow channels.

BACKGROUND OF THE INVENTION

Increases in density, frequency, and power demands of various server hardware components on a printed circuit board (PCB) has resulted in additional cooling requirements, which are typically not achieved utilizing current air-cooling methods. A solid cast aluminum stiffener is typically mounted to an underside (i.e., bottom surface) of the PCB for mechanical support, where the solid stiffener allows for the PCB to meet shipping shock and vibration testing requirements. The solid stiffener limits cooling access to a top surface of the PCB, since the PCB and solid casted aluminum stiffener assembly are typically mounted to a lower interior surface of a chassis enclosure. Components mounted on the top surface of the PCB (e.g., DIMMs & heatsinks), require that the PCB sit close to the lower interior surface of the chassis enclosure to ensure that a height of the components fit within the bounds of an upper interior surface of the chassis enclosure.

SUMMARY

One aspect of an embodiment of the present invention discloses an apparatus for providing a stiffener and cooling to a printed circuit board, the apparatus comprising: a printed circuit board disposed on a top surface of a stiffening cooling structure, wherein a lower surface of the printed circuit board is opposite the top surface of the stiffening cooling structure. The apparatus further comprising one or more channels of the stiffening cooling structure defined by the top surface of the stiffening cooling structure, a bottom surface of the stiffening cooling structure, and one or more support members, wherein the one or more support members are positioned between the top surface of the stiffening cooling structure and the bottom surface of the stiffening cooling. The apparatus further comprising one or more apertures in the top surface of the stiffening cooling structure to direct airflow from the one or more channels of the stiffening cooling structure to one or more components disposed on a top surface of the printed circuit board.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which:

FIG. 2A depicts a stiffening cooling structure, in accordance with one embodiment of the present invention.

FIG. 2B depicts a front view of the stiffening cooling structure of FIG. 2A, in accordance with one embodiment of the present invention.

FIG. 4B depicts a side view of a stiffening cooling structure and printed circuit board with cooling apertures, in accordance with one embodiment of the present invention.

FIG. 5A depicts an exploded side view of a stiffening cooling structure and a printed circuit board with an underside heatsink, in accordance with one embodiment of the present invention.

FIG. 5B depicts a side view of an assembled stiffening cooling structure and printed circuit board with the underside heatsink of FIG. 5A, in accordance with one embodiment of the present invention.

FIG. 5C depicts an enhanced and exploded view of the underside heatsink of FIG. 5A, in accordance with one embodiment of the present invention.

FIG. 6C depicts an enhanced side view of the stiffening cooling structure the attachable cooling channel of FIG. 6A, in accordance with one embodiment of the present invention.

DETAILED DESCRIPTION

Figure 1A:
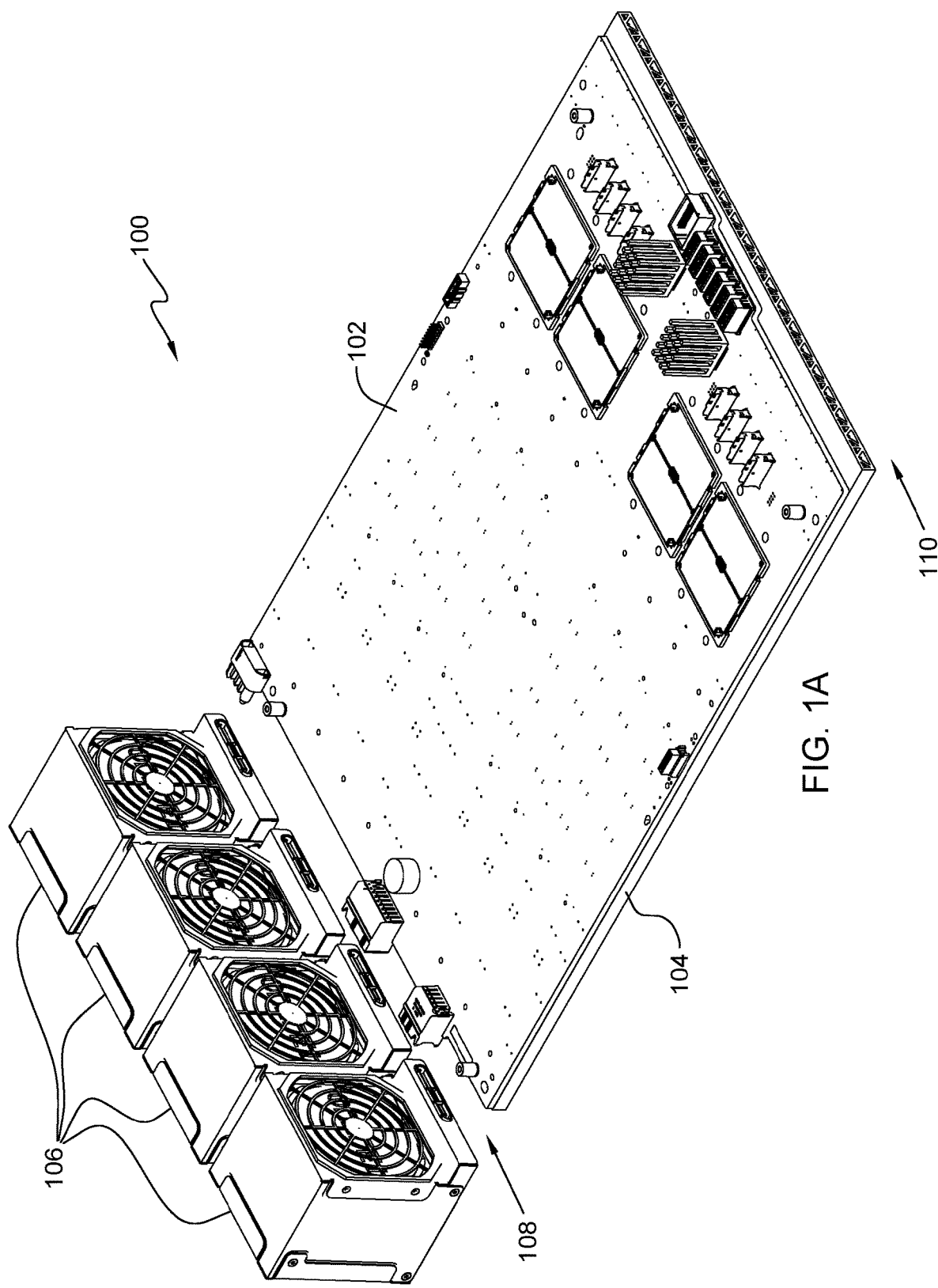
FIG. 1A depicts a stiffening cooling structure and printed circuit board assembly, in accordance with an embodiment of the present invention.

Embodiments of the present invention provide a stiffener cooling structure with internal cooling channels, where the stiffener cooling structure is coupled to an underside (i.e., lower surface) of a printed circuit board (PCB). One or more fans positioned at a front area of the stiffener cooling structure force air at a first end through one or more internal channels and heated air is exhausted at a second end of the stiffener cooling structure. Each of the one or more internal channel can utilize a valve to vary the flow of air at the first end of each internal channel components based on cooling requirements. Furthermore, the stiffener cooling structure can include one or more zones of internal channels for cooling specific components or areas of the PCB. The one or more internal channels of the stiffener cooling structure can be fabricated utilizing additive manufacturing (i.e., 3D printing), selective laser sintering (SLS), and advanced brazing techniques.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure or first member, is present on a second element, such as a second structure or second member, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements. The term substantially, or substantially similar, refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

FIG. 1A depicts a stiffening cooling structure and printed circuit board assembly, in accordance with an embodiment of the present invention. In this embodiment, stiffening cooling structure and PCB assembly 100 includes PCB 102 and stiffening cooling structure 104, where a lower surface (i.e., underside) of PCB 102 is disposed on and mechanically coupled to a top surface of stiffening cooling structure 104. For discussions purposes, an enclosure for stiffening cooling structure and PCB assembly 100 is not illustrated in FIG. 1A. Stiffening cooling structure 104 provides structural support for PCB 102 to ensure that PCB 102 is not damage due to shock and vibrations experienced during shipment. Furthermore, stiffening cooling structure 104 provides cooling airflow to the lower surface of PCB 102, where one or more components are suspended within stiffening cooling structure 104 and/or one or more apertures in PCB 102 and stiffening cooling structure 104 allow cooling airflow to bypass portions of a top surface of PCB 102. Multiple fans 106 are positioned at front area 108 of stiffening cooling structure and PCB assembly 100, where fans 106 force air towards PCB 102 and one or more internal channels of stiffening cooling structure 104 at front area 108. Heated air is exhausted away from PCB 102 and the one or more internal channels of stiffening cooling structure 104, at rear area 110.

Figure 1B:
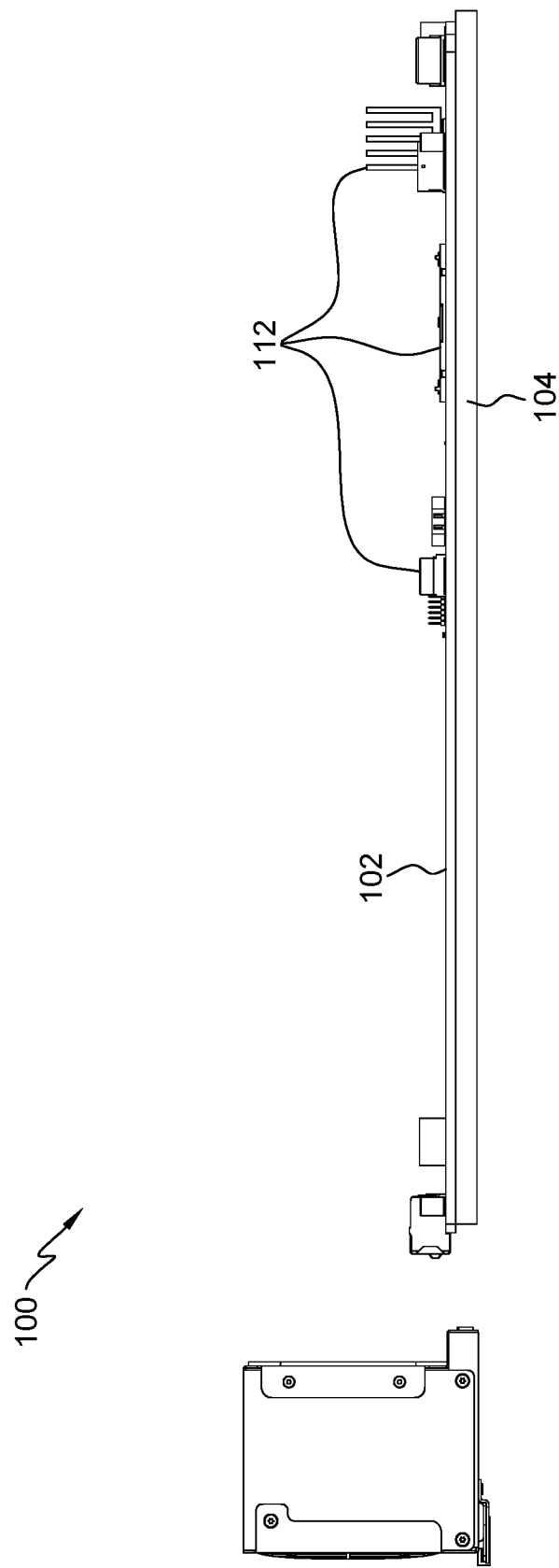
FIG. 1B depicts a side view of the stiffening cooling structure and printed circuit board assembly of FIG. 1A, in accordance with an embodiment of the present invention.

FIG. 1B depicts a side view of the stiffening cooling structure and printed circuit board assembly of FIG. 1A, in accordance with an embodiment of the present invention. In this embodiment, stiffening cooling structure 104 extends a length of PCB 102, where an area of the top surface of stiffening cooling structure 104 is greater an area of the lower surface of PCB 102. Dimensions of stiffening cooling structure 104 are at least dependent on structure support requirements to ensure that PCB 102 meets shipping shock and vibration testing requirements. A height of stiffening cooling structure 104 is dependent on packaging requirements of the enclosure housing stiffening cooling structure and PCB assembly 100 (not illustrated in FIG. 1B), as well as cooling requirements of components on PCB 102. Due to a limited total height available within the enclosure for packaging PCB 102, stiffening structure 104, and PCB components 112, a height of stiffening structure 104 is dependent on a remaining height available subsequent to PCB 102 with PCB components 112 being placed inside the enclosure. Furthermore, a height of stiffening structure 104 accounts for any components (e.g., heatsink) mounted on the underside of PCB 102 and suspended (i.e., disposed) within stiffening structure 104, discussed in further detail with regards to FIGS. 5A-5C. In some embodiments, a thermal insulator layer is placed between the lower surface of PCB 102 and the top surface of stiffening cooling structure 104.

FIG. 2A depicts a stiffening cooling structure, in accordance with one embodiment of the present invention. Stiffening cooling structure 104 includes top surface 202 and bottom surface 204, where PCB 102, from FIG. 1A-1B is disposed and coupled to top surface 202. Bottom surface 204 is disposed on a lower interior surface of an enclosure, where bottom surface 204 is mechanically coupled to the lower interior surface to prevent movement of stiffening cooling structure 104. In one embodiment, bottom surface 204 is shared with a lower interior surface (i.e., same surface) of an enclosure that stiffening cooling structure 104 is positioned. Cooled air enters stiffening cooling structure 104 at front portion 206 and exhausts out of stiffening cooling structure 104 at rear portion 208. Stiffening cooling structure 104 includes multiple channels 210 for guiding air from front portion 206 to rear portion 208. In this embodiment, the multiple channels 210 are positioned in parallel and run the length of stiffening cooling structure 104. In other embodiment, the multiple channels 210 are positioned in a manner to direct airflow within stiffening cooling structure 104 such that airflow is directed to one or more components suspended within stiffening cooling structure 104 (not illustrated in FIG. 2A) or directed to one or more apertures on top surface 202.

FIG. 2B depicts a front view of the stiffening cooling structure of FIG. 2A, in accordance with one embodiment of the present invention. The front view of stiffening cooling structure 104 illustrates front portion 206, where air is forced into the multiple channels 210. Each of the multiple channels 210 are defined by top surface 202, bottom surface 204, and support members 212, where support members 212 provide the structural integrity in the form of a truss for supporting the weight of PCB 102 with PCB components 112 disposed on top surface 202. The combination of top surface 202, bottom surface 204, and support members 212 allow for the integration of multiple channels 210 within stiffening cooling structure 104. A quantity, orientation, and position of support members 212 is dependent on structural requirements of stiffening cooling structure 104 for supporting the weight of PCB 102 to ensure that PCB 102 disposed on stiffening cooling structure 104 meets shipping shock and vibration testing requirements. In some embodiments, stiffening cooling structure 104 includes multiple members protruding from an upper interior surface of channels 210, where the multiple protruding member are integrated into top surface 202 of stiffening cooling structure 104. Stiffening cooling structure 104 can further include one or more cavities recessed into top surface 202 (not illustrated in FIG.

2B), where the one or more cavities recessed into top surface 202 align with and accept one or more protruding portions (e.g., resistors, capacitors, solder joints) of an underside of PCB 102.

Figure 3:
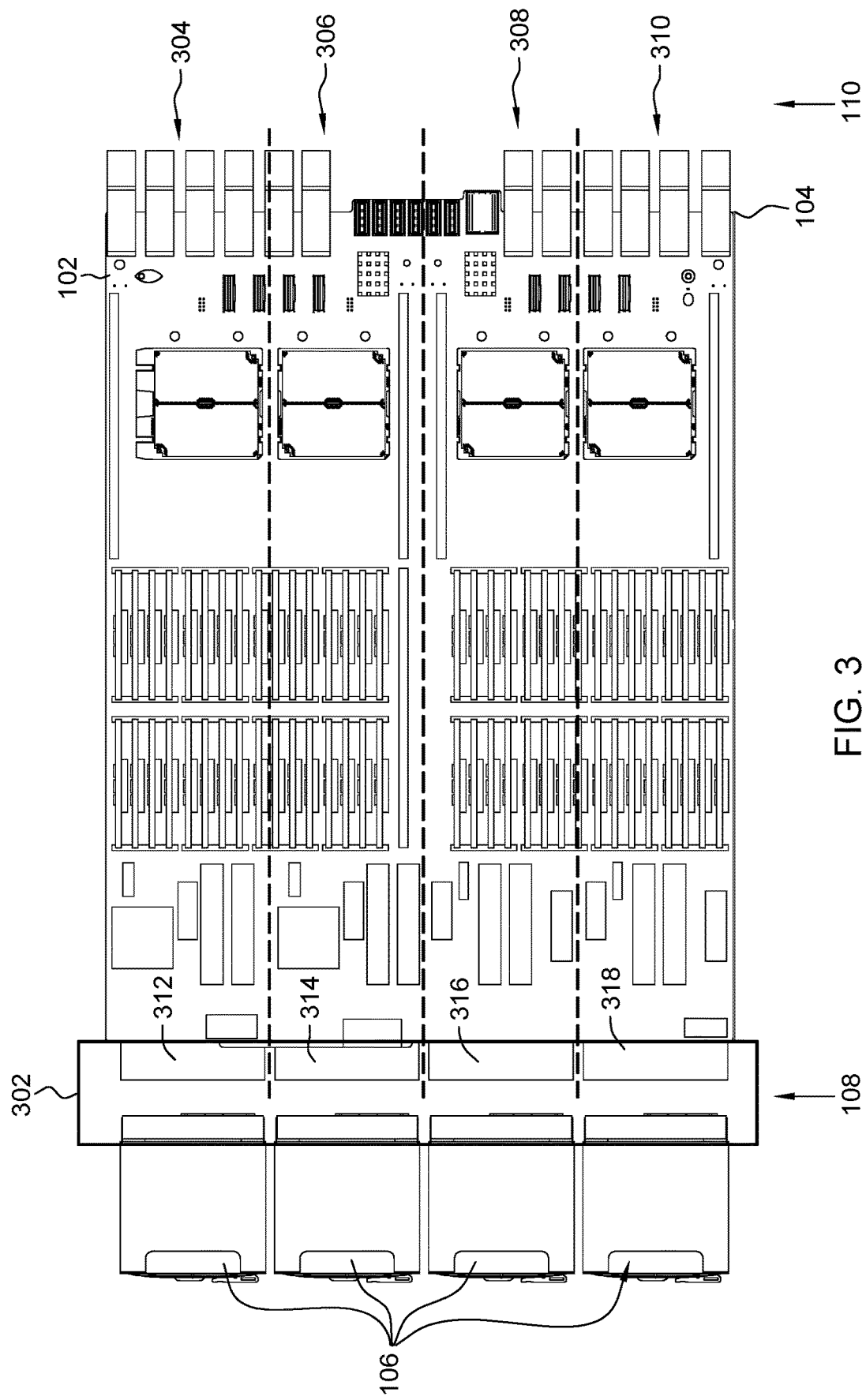
FIG. 3 depicts a top view of a printed circuit board with multiple cooled zones of a stiffening cooling structure, in accordance with one embodiment of the present invention.

FIG. 3 depicts a top view of a printed circuit board with multiple cooled zones of a stiffening cooling structure, in accordance with one embodiment of the present invention. Stiffening cooling structure and PCB assembly 100 includes plenum 302 at front area 108, where fans 106 force air towards PCB 102 and stiffening cooling structure 104 creating a high pressure area in plenum 302. PCB 102 and stiffening cooling structure 104 are divided into portions 304, 306, 308, and 310, where valves 312, 314, 316, and 318 regulate airflow through each of the respective portions 304, 306, 308, and 310. In this embodiment, each portion 304, 306, 308, 310 includes at least one component (e.g., heatsink) requiring cooling, mechanically and/or electrically coupled to an underside of PCB 102 and suspended within stiffening cooling structure 104. As fans 106 force area into plenum 302 at front area 108, valves 312, 314, 316, and 318 regulate airflow through stiffening cooling structure 104 towards rear area 110, where the heated air is exhausted away from stiffening cooling structure and PCB assembly 100. Each valve 312, 314, 316, and 318 operates independently depending on cooling requirements for the components suspended within stiffening cooling structure 104 in portions 304, 306, 308, and 310. Valves 312, 314, 316, and 318 can be a solenoid valve, a piezoelectric valve, a bimetal valve, or any type of control valve known in the art.

Figure 4A:
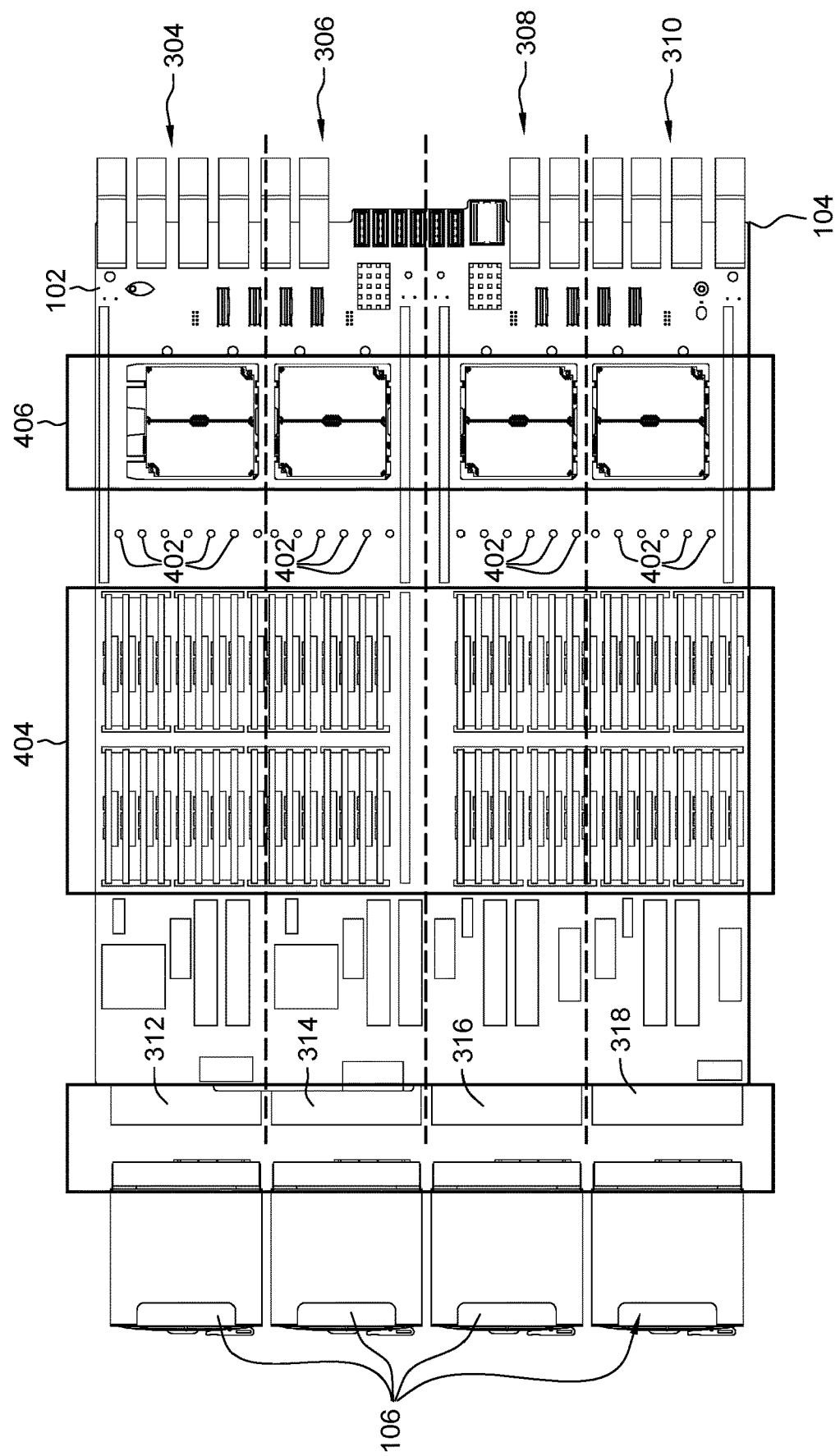
FIG. 4A depicts a top view of a printed circuit board with multiple cooling apertures and cooled zones of a stiffening cooling structure, in accordance with one embodiment of the present invention.

FIG. 4A depicts a top view of a printed circuit board with multiple cooling apertures and cooled zones of a stiffening cooling structure, in accordance with one embodiment of the present invention. Similar to FIG. 3, stiffening cooling structure and PCB assembly 100 includes PCB 102 and stiffening cooling structure 104, where PCB 102 and stiffening cooling structure 104 are divided into portions 304, 306, 308, and 310. PCB 102 and stiffening cooling structure 104 includes apertures 402 for bypassing airflow through stiffening cooling structure 104 to components mechanical and/or electrically coupled to a top surface of PCB 102 in area 406. Area 404 includes multiple dual in-line memory modules (DIMMs) which preheats air moving over a top surface of PCB 102, thus reducing cooling effectiveness when the preheated air reaches area 406. Stiffening cooling structure 104 allows for air to bypass area 404 with the multiple DIMMs disposed on the top surface of PCB 102. Fans 106 force area into plenum 302 at front area 108, where valves 312, 314, 316, and 318 regulate airflow through stiffening cooling structure 104 towards apertures 402. Air exiting apertures 402 is directed towards area 406 and exhausted away from stiffening cooling structure and PCB assembly 100 at rear area 110. Dimensions of each aperture 402 and a quantity of apertures 402 associated with each portion of PCB 102 is dependent on cooling requirements for components located in area 406.

FIG. 4B depicts a side view of a stiffening cooling structure and printed circuit board with cooling apertures, in accordance with one embodiment of the present invention. As previously discussed in FIG. 4A, stiffening cooling structure 104 allows for air to bypass area 404 with the multiple DIMMs disposed on the top surface of PCB 102. Though stiffening cooling structure 104 extends a length of PCB 102 to provide structural support, channel 210 extends a portion of the length of PCB 102. Channel 210 extends to a location of apertures 402, where air directed into channel 210 of stiffening cooling structure 104 exits through apertures 402. Guide wall 408 extends parallel to apertures 402, across PCB 102 to direct air from channel 210 in an upward direction towards apertures 402. As air exits aperture 402, air passing over the top surface of PCB 102 guides the cooled air towards area 406. In other embodiments, an angle of guide wall 408 (e.g., 45°) matches an angle of aperture 402 to minimize an angle of airflow re-direction from channel 210 of stiffening cooling structure 104 to PCB 102. In yet another embodiment, a second guide wall (not illustrated in FIG. 4B) is disposed on the top surface of PCB 102 to direct airflow from aperture 402 towards area 406. The second guide wall is disposed over aperture 402 at an angle (e.g., 45°) to assist in redirecting air from aperture 402 towards area 406.

FIG. 5A depicts an exploded side view of a stiffening cooling structure and a printed circuit board with an underside heatsink, in accordance with one embodiment of the present invention. In this embodiment, PCB 102 includes PCB components 112 and heatsink 502, where PCB components 112 are coupled to a top surface of PCB 102 and heatsink 502 is coupled to a lower surface (i.e., underside) of PCB 102. A cross-sectional side view of stiffening cooling structure 104 illustrates cavity 504 in which heatsink 502 is placeable, when PCB 102 is mechanically coupled to stiffening cooling structure 104. As PCB 102 is lowered on top surface 202 of stiffening cooling structure 104, heatsink 502 aligns with cavity 504, and fins 506 of heatsink 506 are disposed within channel 210 of stiffening cooling structure 104.

FIG. 5B depicts a side view of an assembled stiffening cooling structure and printed circuit board with the underside heatsink of FIG. 5A, in accordance with one embodiment of the present invention. Heatsink 502 is disposed within cavity 504 of stiffening cooling structure 104. As fans 106 force air towards stiffening cooling structure 104, channel 210 directs air through stiffening cooling structure 104 towards heatsink 502. In other embodiments, stiffening cooling structure 104 includes multiple cavities 504 for placeable heatsinks 502 mounted on the lower surface of PCB 102. Stiffening cooling structure 104 can include additional support members in a vicinity of each cavity 504 as reinforcements to ensure the structural integrity of stiffening cooling structure 104 is maintained to support PCB 102.

FIG. 5C depicts an enhanced and exploded view of the underside heatsink of FIG. 5A, in accordance with one embodiment of the present invention. Once heatsink 502 is disposed in cavity 504, fins 506 are positioned in parallel to channels 210. Fins 506 can either align with or be offset to the parallel channels 210 depending on the application and cooling requirements. Air flowing from front area 108 through channels 210, passes through fins 506 of heatsink 502, and exhausts out of stiffening cooling structure 104 at rear area 110. In one embodiment, a height of fins 506 is equal to a height of channel 210, where a top surface of fins 506 contacts an inner surface of cavity 504 (i.e., bottom surface 204 of stiffening cooling structure 104). In another embodiment, a height of fins 506 is less than a height of channel 210, where a gap is present between a top surface of fins 506 and an inner surface if cavity 504. Stiffening cooling structure 104 can include a gasket on a perimeter of an opening of cavity 504 to ensure that a seal is created when heatsink 502 is disposed in cavity 504.

Figure 6A:
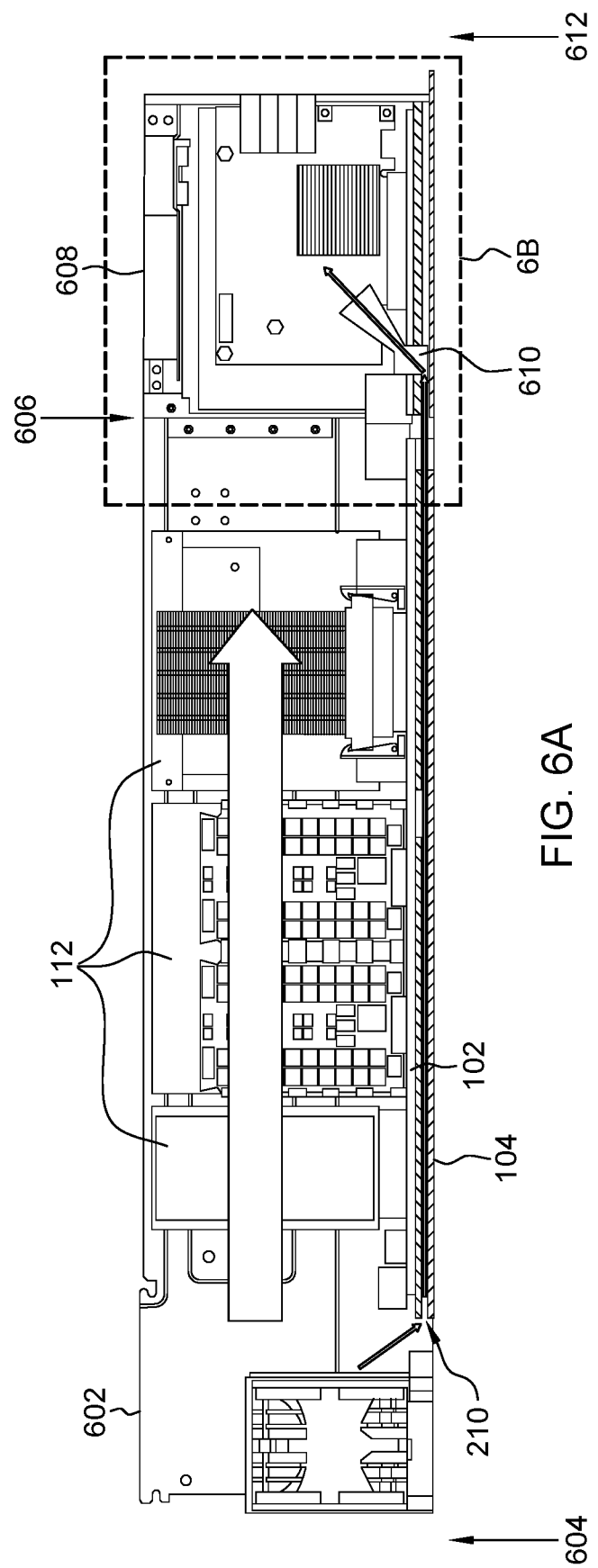
FIG. 6A depicts a side view of a stiffening cooling structure and printed circuit board assembly with an attachable cooling channel, in accordance with one embodiment of the present invention.

FIG. 6A depicts a side view of a stiffening cooling structure and printed circuit board assembly with an attachable cooling channel, in accordance with one embodiment of the present invention. In this embodiment, enclosure 602 includes PCB 102 with PCB components 112 and stiffening cooling structure 104, where stiffening cooling structure 104 is mechanically coupled to a lower surface of enclosure 602. Enclosure 602 includes fans 106 positioned at a front enclosure area 604 for directing air towards PCB components 112 on PCB 102 and towards channel 210 of stiffening cooling structure 104. Positioned at rear enclosure area 606 of enclosure 602 is cassette 608, where cassette 608 is mechanically coupled to the rear of enclosure 602. As fans 106 direct air towards PCB components 112, the air is heated prior to reaching cassette 608. Stiffening cooling structure 104 allows for air to bypass the PCB components 112, where cooling attachment 610 coupled to stiffening cooling structure 104 directs air into cassette 608. The air flowing from cooling attachment 610 and the air flowing over the PCB components 112 is vented at the rear of cassette 608 into rear cassette area 612.

Figure 6B:
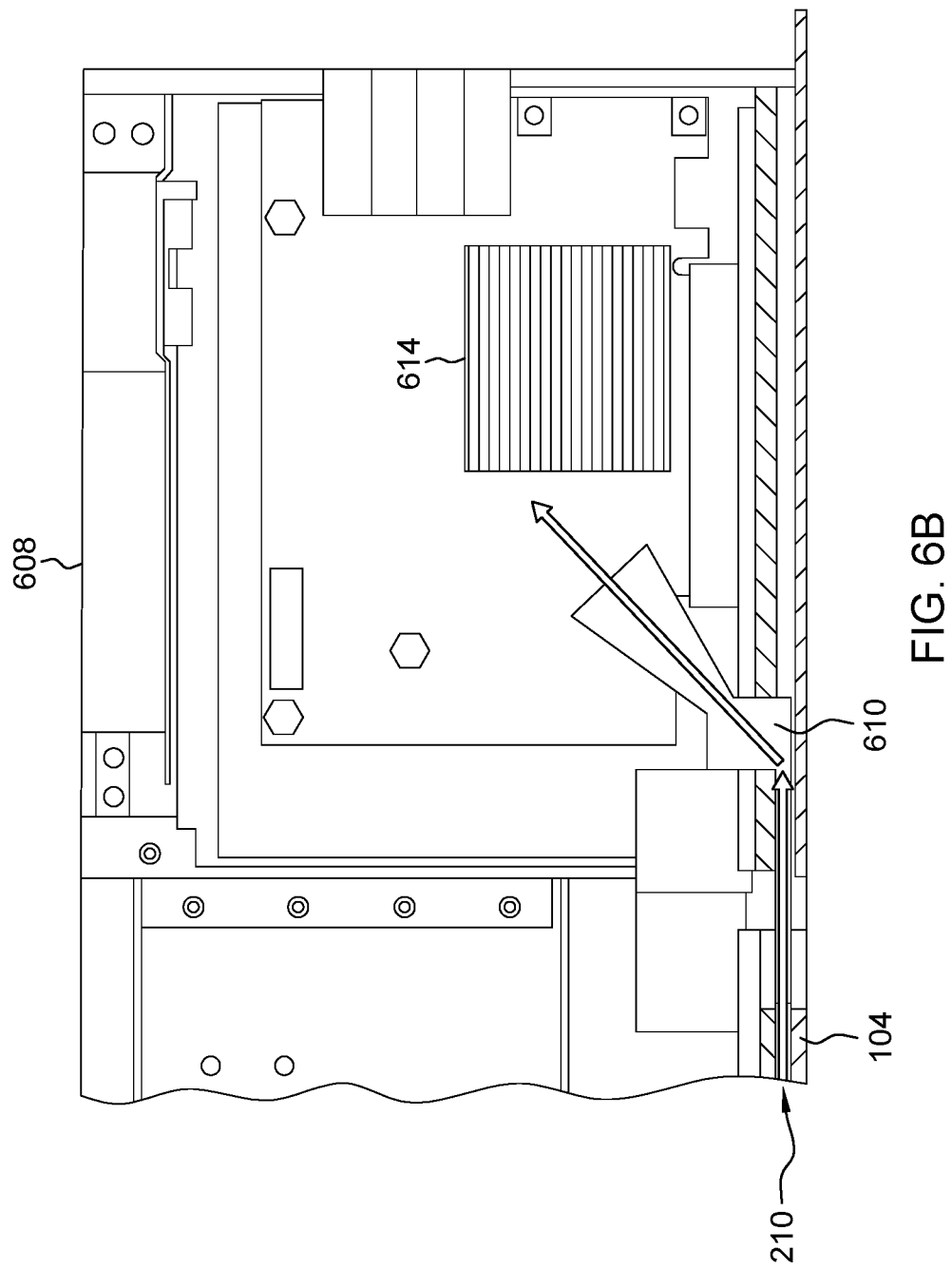
FIG. 6B depicts an enhanced side view of the stiffening cooling structure and printed circuit board assembly with the attachable cooling channel of FIG. 6A, in accordance with one embodiment of the present invention.

FIG. 6B depicts an enhanced side view of the stiffening cooling structure and printed circuit board assembly with the attachable cooling channel of FIG. 6A, in accordance with one embodiment of the present invention. A shape and position of cooling attachment 610 is such that air flowing from stiffening cooling structure 104 is directed towards heatsink component 614 located in cassette 608. Cooling attachment 610 is couplable to an end of stiffening cooling structure 104 or is placeable into a cavity of stiffening cooling structure 104, where air flows through channel 210 and into cooling attachment 610. One or more cooling attachments 610 are couplable to stiffening cooling structure 104 depending on the application and cooling requirements for one or more components located in cassette 608. Additionally, a valve can be place between channel 210 of stiffening cooling structure 104 and cooling attachment 610 to regulate airflow exiting cooling attachment 610.

FIG. 6C depicts an enhanced side view of the stiffening cooling structure the attachable cooling channel of FIG. 6A, in accordance with one embodiment of the present invention. Cooling attachment 610 is couplable to rear portion 208 of surface of stiffening cooling structure 104 utilizing one or more quick connecting fasteners or clips to prevent cooling attachment 610 from decoupling due to shock and vibrations during shipment. Cooling attachment 610 can include a protruding inner channel that slides inside channel 610, when cooling attachment 610 is coupled to stiffening cooling structure 104. In one example, channel 610 is circular in shape with radius A and protruding inner channel is circular in shape with radius B, where radius A is greater than radius B. In another example, channel 610 is quadrilateral in shape with an area A and protruding inner channel is quadrilateral in shape with area B, where area A is greater than area B. In this embodiment, diffuser portion 616 of cooling attachment 610 is horn-shaped to assist with baffling air flowing through cooling attachment 610 towards one or more components requiring cooling. Diffuser portion 616 can be integrated into cooling attachment 610 as a single structure and/or assembly or diffuser portion 616 be part of the structure of cassette 608. A shape and dimensions of diffuser portion 616 of cooling attachment 610 is dependent on cooling requirements for components located in the vicinity.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described preferred embodiments of a stiffener cooling structure (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for providing a stiffening cooling structure for a printed circuit board, the apparatus comprising:
   the printed circuit board disposed on a top surface of the stiffening cooling structure, wherein a lower surface of the printed circuit board is opposite the top surface of the stiffening cooling structure;
   one or more channels of the stiffening cooling structure defined by the top surface of the stiffening cooling structure, a bottom surface of the stiffening cooling structure, and one or more support members, wherein the one or more support members are positioned between the top surface of the stiffening cooling structure and the bottom surface of the stiffening cooling;
   one or more apertures in the top surface of the stiffening cooling structure to direct airflow from the one or more channels of the stiffening cooling structure to one or more components disposed on a top surface of the printed circuit board; and
   one or more apertures in the printed circuit board direct the airflow from the one or more apertures in the top surface of the stiffening cooling structure to the one or more components disposed on a top surface of the printed circuit board.

2. The apparatus of claim 1, wherein the one or more apertures in the top surface of the stiffening cooling structure at least partially align with the one or more apertures in the printed circuit board.

3. The apparatus of claim 1, further comprising:
   a fan disposed at a first end of the stiffening cooling structure to direct the airflow to the one or more channels of the stiffening structure, wherein the airflow is exhausted through the one or more apertures in the top surface of the stiffening cooling structure.

4. The apparatus of claim 3, further comprising:
   a first valve positioned at the first end of the stiffening cooling structure to regulate the airflow to a first channel of the one or more channels, wherein the first channel is associated with a first aperture of the one or more apertures in the top surface of the stiffening cooling structure.

5. The apparatus of claim 4, further comprising:
   a second valve positioned at the first end of the stiffening cooling structure to regulate the airflow to a second channel of the one or more channels, wherein the second channel is associated with a second aperture of the one or more apertures in the top surface of the stiffening cooling structure.

6. The apparatus of claim 1, wherein the stiffening cooling structure is disposed on an inner lower surface of an enclosure for the printed circuit board and the stiffening cooling structure.

7. The apparatus of claim 1, further comprising:
   a component coupled to the lower surface of the printed circuit board, wherein a portion of the component is suspended in a cavity defined by the one or more apertures in top surface of the stiffening cooling structure.

8. The apparatus of claim 7, wherein the portion of the component is further suspended in the one or more channels of the stiffening cooling structure, wherein the one or more channels of the stiffening cooling structure direct the airflow to the portion of the component.

9. The apparatus of claim 8, wherein the component is a heatsink.

10. The apparatus of claim 8, wherein the component is electrically coupled to the printed circuit board.

11. The apparatus of claim 8, wherein one or more gaskets create a seal between the component and the one or more apertures in top surface of the stiffening cooling structure.

12. The apparatus of claim 1, further comprising:
a cooling attachment coupled to a first end of the stiffening cooling structure, wherein the cooling attachment directs the airflow to the one or more components disposed on a top surface of the printed circuit board.

13. The apparatus of claim 12, further comprising:
a fan disposed at a second end of the stiffening cooling structure to direct the airflow to the one or more channels of the stiffening structure, wherein the airflow is exhausted through the cooling attachment coupled to the first end, wherein the first end of the stiffening cooling structure is opposite the second end of the stiffening cooling structure.

14. The apparatus of claim 1, further comprising:
a cassette coupled to an enclosure, wherein the stiffening cooling structure is disposed on an inner lower surface of an enclosure for the printed circuit board and the stiffening cooling structure; and
a cooling attachment coupled to a first end of the stiffening cooling structure, wherein the cooling attachment directs the airflow to the one or more components disposed in the cassette.

15. The apparatus of claim 14, further comprising:
a fan disposed at a second end of the stiffening cooling structure on the inner lower surface of the enclosure to direct the airflow to the one or more channels of the stiffening structure, wherein the airflow is exhausted through the cooling attachment coupled to the first end, wherein the first end of the stiffening cooling structure is opposite the second end of the stiffening cooling structure.

* * * * *